United States Patent
Deguenther et al.

(10) Patent No.: US 10,061,203 B2
(45) Date of Patent: Aug. 28, 2018

(54) BEAM DISTRIBUTING OPTICAL DEVICE AND ASSOCIATED UNIT, SYSTEM AND APPARATUS

(71) Applicant: Carl Zeiss SMT GmbH, Oberkochen (DE)

(72) Inventors: Markus Deguenther, Aalen (DE); Michael Patra, Oberkochen (DE); Thomas Korb, Schwarbisch Gmuend (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/244,234

(22) Filed: Aug. 23, 2016

(65) Prior Publication Data

US 2016/0357114 A1 Dec. 8, 2016

Related U.S. Application Data

(63) Continuation of application No. PCT/EP2015/053727, filed on Feb. 23, 2015.

(30) Foreign Application Priority Data

Feb. 25, 2014 (DE) .......................... 10 2014 203 348

(51) Int. Cl.
*G03F 7/20* (2006.01)
*G02B 26/08* (2006.01)
(Continued)

(52) U.S. Cl.
CPC ........... *G03F 7/702* (2013.01); *G02B 5/1861* (2013.01); *G02B 26/0808* (2013.01);
(Continued)

(58) Field of Classification Search
CPC .. G03F 7/702; G03F 7/70208; G03F 7/70191; G03F 7/70058
(Continued)

(56) References Cited

U.S. PATENT DOCUMENTS 6,643,065 B1 * 11/2003 Silberman ................. G01J 3/18
359/230
2002/0079432 A1 6/2002 Lee et al.
(Continued)

FOREIGN PATENT DOCUMENTS

DE 10 2006 047 913 A1 4/2008
DE 10 2007 051 520 A1 4/2009
(Continued)

OTHER PUBLICATIONS

German Office Action, with translation thereof, for corresponding DE Appl No. 10 2014 203 348.9, dated Oct. 16, 2014.
(Continued)

*Primary Examiner* — Hung Henry Nguyen
(74) *Attorney, Agent, or Firm* — Fish & Richardson P.C.

(57) ABSTRACT

A beam distribution optical unit serves for splitting an incident beam of illumination light into at least two emergent illumination-light beams. The beam distribution optical unit has at least one blazed reflection grating having reflective grating structures. The result is an optical unit in which a plurality of illumination-light beams are efficiently produced from one incident beam of illumination light.

20 Claims, 5 Drawing Sheets

(51) Int. Cl.
  *G02B 5/18* (2006.01)
  *G02B 27/10* (2006.01)
(52) U.S. Cl.
  CPC ..... *G02B 26/0833* (2013.01); *G02B 27/1086* (2013.01); *G03F 7/70191* (2013.01); *G03F 7/70208* (2013.01)
(58) Field of Classification Search
  USPC .............................................. 355/53, 67–71
  See application file for complete search history.

(56) References Cited

U.S. PATENT DOCUMENTS

| | | |
|---|---|---|
| 2004/0033426 A1 | 2/2004 | Den Boef et al. |
| 2004/0174583 A1 | 9/2004 | Chen et al. |
| 2005/0236585 A1* | 10/2005 | Miyake ............... G03F 7/70575 250/492.2 |
| 2007/0222990 A1 | 9/2007 | Musa et al. |
| 2010/0007878 A1 | 1/2010 | Wolleschensky et al. |
| 2010/0253995 A1 | 10/2010 | Reichelt |
| 2011/0222042 A1 | 9/2011 | Iikulca et al. |
| 2011/0228247 A1 | 9/2011 | Mulder et al. |
| 2012/0262772 A1* | 10/2012 | Louradour ........ G02F 1/136277 359/238 |
| 2013/0248728 A1 | 9/2013 | Arnold et al. |

FOREIGN PATENT DOCUMENTS

| | | |
|---|---|---|
| DE | 10 2010 002 822 A1 | 9/2011 |
| DE | 10 2012 204 674 A1 | 9/2013 |
| EP | 1 262 836 A1 | 5/2002 |
| JP | H05-291107 A | 11/1993 |
| JP | H07-263313 A | 10/1995 |
| JP | 2005-302998 A | 10/2005 |
| JP | 2007-300076 A | 11/2007 |
| JP | 2008-022015 A | 1/2008 |
| JP | 2010-272553 A | 12/2010 |
| JP | 2011-187733 A | 9/2011 |
| JP | 2013-025041 A | 2/2013 |
| KR | 2004110434 A * | 12/2004 |
| WO | WO 2007/093433 A1 | 8/2007 |
| WO | WO 2011/157601 A2 | 12/2011 |
| WO | WO 2012/152294 A1 | 11/2012 |
| WO | WO 2013/010151 A1 | 1/2013 |
| WO | WO 2013/185919 A1 | 12/2013 |

OTHER PUBLICATIONS

The International Search Report for corresponding PCT Appl No. PCT/EP2015/053727, dated May 27, 2015.

Japanese office action, with English translation thereof, for corresponding JP Appl No. 2016-0554265, dated Sep. 11, 2017.

* cited by examiner

BEAM DISTRIBUTING OPTICAL DEVICE AND ASSOCIATED UNIT, SYSTEM AND APPARATUS

CROSS-REFERENCE TO RELATED APPLICATIONS

The present application is a continuation of, and claims benefit under 35 USC 120 to, international application PCT/EP2015/053727, filed Feb. 23, 2015, which claims benefit under 35 USC 119 of German Application No. 10 2014 203 348.9, filed Feb. 25, 2014. The entire disclosures of international application PCT/EP2015/053727 and German Application No. 10 2014 203 348.9 are incorporated by reference herein.

SUMMARY

The disclosure relates to a beam distribution optical unit for splitting an incident beam of illumination light into at least two emergent used illumination light beams. The disclosure furthermore relates to an illumination optical unit for lighting an object field with such a beam distribution optical unit, to an optical system with such an illumination optical unit and at least one projection optical unit for imaging the object field into an image field, to a projection exposure apparatus having such a system and a primary light source, to a production method for a microstructured or nanostructured component, and to a component produced with this method.

BACKGROUND

Illumination optical units of the type mentioned in the introductory part are known from WO 2011/157601 A2 and US 2011/0228247 A1. Further illumination optical units are known from WO 2007/093433 A1 and EP 1 262 836 A1. DE 10 2010 002 822 A1 discloses an illumination system for a microlithographic projection exposure apparatus having a collector unit, a reflective grating and, immediately downstream thereof in the direction of the light, a used-light wavelength selection device having at least one selection mirror. DE 10 2006 047 913 A1 discloses a spectral-analytical unit having a diffraction grating, a camera optical unit, a detector row and evaluation electronics. DE 10 2007 051 520 A1 discloses a spatial light modulator having a grating-based modulator element. US 2002/0079432 A1 discloses a two-dimensional blazed MEMS grating.

SUMMARY

The present disclosure seeks to further develop an optical unit in a way such that it efficiently produces a plurality of illumination-light beams from one incident beam of illumination light.

In one aspect, the disclosure provides a beam distribution optical unit for splitting an incident beam of illumination light into at least two emergent used illumination-light beams. The beam distribution optical unit has at least one blazed reflection grating with reflective grating structures.

It has been found in accordance with the disclosure that using a blazed reflection grating ensures the possibility of adjustable distribution of the intensity of one incident illumination-light beam to the intensities of the emergent illumination-light beams. In the extreme cases, the blazed reflection grating can be adjusted such that the entire incident illumination-light beam is reflected into exactly one emergent illumination-light beam. In this case, the blazed reflection grating acts only as a deflection mirror. The blazed reflection grating can be adjusted such that a specified intensity distribution is effected into a plurality of emergent illumination-light beams, such as into two illumination-light beams or in more than two illumination-light beams. The intensity distribution into the various emergent illumination-light beams can be influenced by correspondingly configuring the grating structures, in particular the spacing between neighboring grating structures, i.e. the grating period of the blazed reflection grating, and by specifying a blaze angle. In particular, EUV light in a wavelength range between 5 nm and 30 nm can be used as illumination light. The emission of a synchrotron-radiation-based light source can be used as the illumination light. The emergent illumination-light beams produced via the beam distribution optical unit can be used to illuminate a corresponding number of object fields. Alternatively, the emergent illumination-light beams produced can also together illuminate the same illumination field, for example with different illumination parameters. Such different illumination parameters can be: different illumination directions, different polarizations and/or different intensities. Illumination light is light that is actually used to illuminate an object.

A grating constant of the blazed reflection grating and a blaze angle of the blazed reflection grating can be tuned to a wavelength of the illumination light such that, within a reflection region of the blazed reflection grating to which preference is given by way of selecting the blaze angle, a plurality of orders of diffraction of the blazed reflection grating are reflected with the specified efficiency. This plurality of orders of diffraction can be exactly two orders of diffraction. Alternatively, this plurality of orders of diffraction can also be more than two orders of diffraction, for example three orders of diffraction, four orders of diffraction, five orders of diffraction or more orders of diffraction. The blazed reflection grating can be used as a beam splitter, wherein both the direction of the emergent used illumination-light beam and the distribution of the intensities to the emergent used illumination-light beams can be specified by the grating constant and the blaze angle of the blazed reflection grating.

The grating structures of the blazed reflection grating can be displaceable via actuation for adjusting a blaze angle. The ability to displace the grating structures in this manner permits a defined change of an intensity distribution of the incident illumination-light beam into emergent illumination-light beams. This change can include a change in the number of emergent illumination-light beams and/or a change with respect to the intensity portions of the emergent illumination-light beams. The blaze angle can be continuously variable or step-wise variable.

The grating structures can be in the form of MEMS mirrors. MEMS mirrors as grating structure are suitable for guiding illumination light.

A grating period of the blazed reflection grating can be 80 to 150 times as large as a used wavelength of the illumination light. Such a grating period has proven suitable for producing sufficient spatial separations in the emergent illumination-light beams. In particular, the grating period can be 100 times as large as the used wavelength of the illumination light.

The beam distribution optical unit can have a plurality of blazed reflection gratings which are subjected sequentially to the illumination light. Such blazed reflection gratings which are sequentially subjected have proven particularly suitable for producing a relatively large number of emergent illumination-light beams.

The beam distribution optical unit can be arranged such that each illumination-light beam within the beam distribution optical unit is reflected by the grating structures of a plurality of blazed reflection gratings. Such a cascaded arrangement, in which each illumination-light beam in a light path within the beam distribution optical unit is reflected by the grating structures of a plurality of blazed reflection gratings, has proven particularly suitable, depending on the desired properties associated with the produced illumination-light beams and/or the blazed reflection gratings.

In some embodiments, the beam distribution optical unit has a maximum of one of two emergent illumination-light beams produced by a blazed reflection grating is split further by reflection at at least one further blazed reflection grating. Such a fanned arrangement has proven particularly suitable, depending on the desired properties associated with the produced illumination-light beams and/or the blazed reflection gratings.

The blazed reflection gratings can be arranged such that, after a last reflection at one of the blazed reflection gratings, emergent illumination-light beams propagate in mutually parallel fashion. This has proven particularly suitable for further processing of the emergent illumination-light beams.

An illumination optical unit can be arranged for lighting at least one object field with a beam distribution optical unit described herein. An optical system can have such an illumination optical unit and at least one projection optical unit for imaging the object field into an image field. The advantages of such an illumination optical unit and such an optical system correspond to those which were already explained above with reference to the beam distribution optical unit. The beam distribution can serve for producing a plurality of beams which superpose in the same illumination field or for producing a plurality of beams which each light one illumination field.

In some embodiments, an optical system can have at least one blazed reflection grating of the beam distribution optical unit that is part of an output coupling optical unit which directs an illumination-light beam to one of a plurality of projection optical units of the optical system. The additional function of such an output coupling optical unit reduces the number of components in the optical system for illumination-light deflection. This is advantageous in particular if reflection of the illumination light results in undesired losses.

An optical system can have beam guidance such that a non-decoupled main beam travels along a zigzag path within the beam distribution optical unit. An optical system can have beam guidance such that a non-decoupled main beam travels along polygonal path, in each case deflected in the same direction within the beam distribution optical unit. Such types of beam guidance have proven particularly suitable depending on the desired properties that of the optical system. A non-decoupled main beam which travels along a zigzag path can be guided such that during successive deflections along the zigzag path, the non-uncoupled main beam is reflected only by the blazed reflection grating. The result is a correspondingly efficient output coupling and beam distribution.

A lithographic projection exposure apparatus can have an optical system as described herein and a primary light source. A method can include using such a lithographic projection exposure apparatus to produce a microstructured or nanostructured component. The advantages of such an optical system, lithographic projection exposure apparatus, production method and component correspond to those which have already been explained above with reference to the beam distribution optical unit and the optical system. These advantages come particularly into their own when the beam distribution optical unit is used with EUV illumination light emitted by a synchrotron-radiation-based primary light source. The result is a projection exposure apparatus in which the structures of a plurality of reticles are projected in particular simultaneously onto associated wafers and which has a correspondingly high throughput.

BRIEF DESCRIPTION OF THE DRAWINGS

Exemplary embodiments of the disclosure are explained in greater detail below with reference to the drawings, in which.

DETAILED DESCRIPTION OF EXEMPLARY EMBODIMENTS

Figure 1:
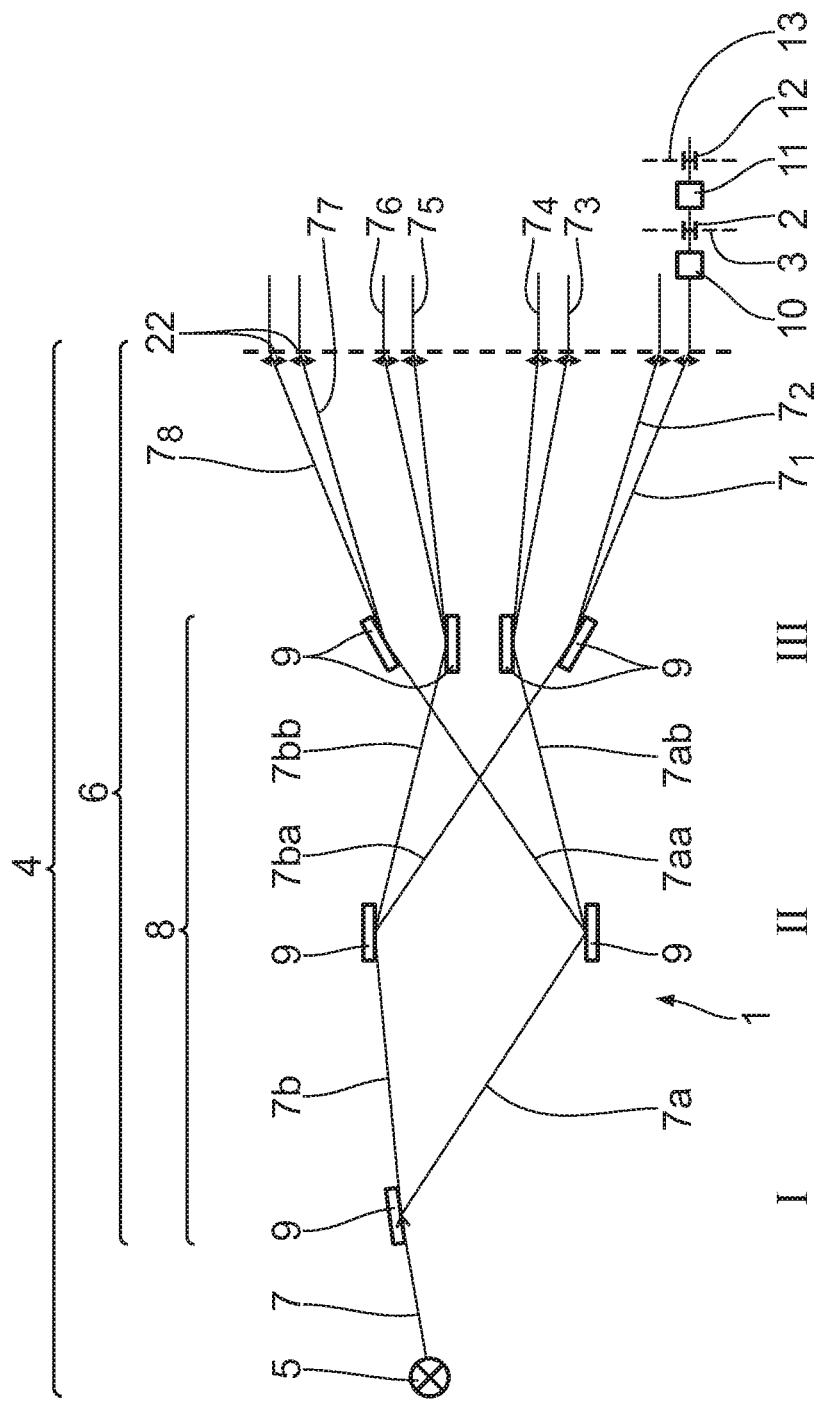
FIG. 1 shows very schematically a microlithographic projection exposure apparatus having an optical system with an illumination optical unit for lighting an object field to be imaged during the projection exposure, wherein the illumination optical unit has a beam distribution optical unit for splitting an incident illumination-light beam into a total of eight emergent illumination-light beams.

FIG. 1 schematically shows a microlithographic projection exposure apparatus 1, which is configured with a total of eight wafer scanners and is used in the production of semi-conductor components and other finely structured components. A projection exposure apparatus in the form of a scanner is known in principle from WO 2013/185919 A1. The projection exposure apparatus 1 operates for achieving resolutions up to the nanometer range with light in particular from the extreme ultraviolet range (EUV), for example in the range of between 5 nm and 30 nm.

An illumination system of the projection exposure apparatus 1, which is designated 4 overall, serves for the defined lighting of a total of eight objects or illumination fields 2, each in an object or reticle plane 3, in which a structure to be transferred in the form of a reticle (not illustrated in more detail) is arranged. The schematic FIG. 1 merely shows one of the total of eight object fields 2 and the components arranged upstream and downstream thereof.

The illumination system 4 comprises a primary light source 5 and an illumination optical unit 6 having the optical components for guiding used illumination light or imaging light 7 to the object field 2. In addition to a beam distribution optical unit 8, to be explained in more detail below, having a plurality of blazed reflection gratings 9 which are arranged in cascaded fashion, an optical beam shaping unit 10, which shapes a respective illumination-light beam $7_i$ (i=1, ..., 8), which is emergent from the beam distribution optical unit 8, for illuminating the respective object field 2, also belongs to the illumination optical unit 6. A field facet mirror, a pupil facet mirror and a polarization optical unit can belong to the respective beam shaping unit 10. The primary light source 5 is a synchrotron-radiation-based light source, for example a free-electron laser (FEL). The illumination optical unit 6 is implemented exclusively with reflective components.

The respective object field 2 is imaged using a respective projection optical unit 11 into an image field 12 in an image plane 13. The projection exposure apparatus 1 thereby images a section of the reticle in the respective object field 2 onto a wafer in the associated image field 12. The reticle on the one hand and the wafer on the other are here intermittently or continuously displaced in a scanning direction.

Together with the respective illumination optical unit 6, the projection optical unit 11 forms an optical system of the projection exposure apparatus 1.

Figure 2:
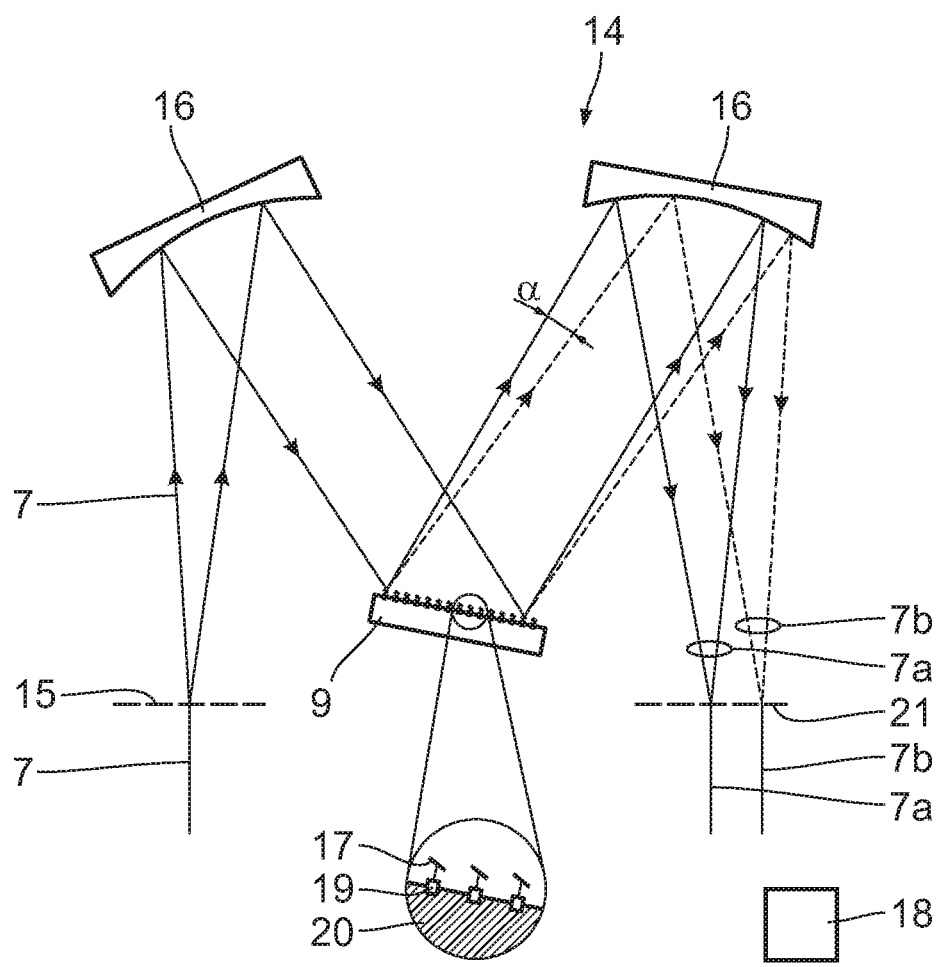
FIG. 2 shows in greater detail one embodiment of a beam distribution optical unit which can be used in the illumination optical unit of FIG. 1 for splitting the incident illumination-light beam into two emergent illumination-light beams, wherein the beam distribution optical unit has a blazed reflection grating with grating structures that are displaceable by way of actuation for adjusting a blaze angle.

FIG. 2 schematically shows one embodiment of a beam distribution optical unit 14 for splitting an incident beam of the illumination light 7 into two emergent illumination-light beams 7a, 7b. The core of the beam distribution optical unit 14 is a blazed reflection grating 9, which can also be used in a corresponding form in the beam distribution optical unit 8 of FIG. 1. In this respect, the following description of the beam distribution optical unit 14 also applies to the beam distribution optical unit 8 of FIG. 1.

The beam distribution optical unit 14 has a similar structure as a Czerny-Turner monochromator, but is employed differently, as will be described below. The incident beam of the illumination light 7 first passes through an intermediate focal plane 15 and is then collimated by a concave mirror 16. The parallelized beam of the illumination light 7 is then incident on the blazed reflection grating 9. The reflection grating 9 is not monolithic. The individual grating periods of the blazed reflection grating 9 are formed by MEMS mirrors 17 that are displaceable via actuation, as is schematically shown in FIG. 2 by the detail enlargement. Each MEMS mirror 17 is connected to an actuator 19, which is actuatable individually by way of the central controller 18, for setting a tilt angle and thus a blaze angle of the grating 9. The MEMS mirrors 17 and the actuators 19 are supported by a support body 20 of the blazed reflection grating 9. With respect to the size of the MEMS mirrors 17 and their spacing, FIG. 2 is not to scale.

A grating constant of the blazed reflection grating 9 and a blaze angle are tuned to the wavelength of the illumination light 7 such that, within the reflection region of the grating 9 to which preference is given by way of the selection of the blaze angle, a plurality of orders of diffraction, in particular exactly two orders of diffraction, of the grating 9 are reflected with specified efficiency. This is illustrated in FIG. 2 by way of example with solid lines for a first order of diffraction of the blazed reflection grating 9 for the illumination light 7 and with dashed lines for a second order of diffraction. The first order of diffraction produces the illumination-light partial beam 7a, and the second order of diffraction produces the illumination-light partial beam 7b. After reflection at the blazed reflection grating 9 and at a further concave mirror 16, the illumination-light partial beams 7a, 7b first pass through a further intermediate focal plane 21 and are then guided by associated beam shaping units to the respective object fields 2 for reticle illumination, as was already explained above in connection with the embodiment of FIG. 1.

A grating period of the blazed reflection grating 9 is, for example, 100 times as large as the wavelength of the illumination light 7. A wavelength of the illumination light 7 of 13 nm gives a grating period of 1.3 μm.

By tilting the MEMS mirrors 17 and correspondingly specifying a blaze angle, it is possible to shift the maximum of the reflection over the possible zero-order diffraction angles such that an intensity ratio of the resulting illumination-light partial beams 7a, 7b ..., which are reflected by the blazed reflection grating 9, can be continuously adjusted.

In the beam distribution optical unit 8 of FIG. 1, blazed reflection gratings 9 are arranged in cascaded fashion in a beam path which corresponds to the beam path of the illumination light 7 in the embodiment of FIG. 2 between the two concave mirrors 16. What is used here is the fact that the incident beam of the illumination light 7 when using the synchrotron-radiation-based light source 5 is already parallelized. Alternatively, a beam shaping optical unit (not illustrated in FIG. 1) upstream of the blazed reflection gratings 9 can be used for parallelizing the illumination light 7.

In the beam distribution optical unit 8 of FIG. 1, a total of seven blazed reflection gratings 9 are arranged in three cascades I, II and III.

The blazed reflection grating 9 of cascade I produces two emergent beams 7a, 7b from the incident beam of the illumination light 7.

The two blazed reflection gratings 9 of the following cascade II produce two emergent illumination-light beams 7aa, 7ab from the incident illumination-light beam 7a on the one hand and two emergent illumination-light beams 7ba, 7bb from the incident illumination-light beam 7b on the other hand.

The four blazed reflection gratings 9 of the subsequent cascade III produce two emergent illumination-light partial beams $7_7$ and $7_8$ from the incident illumination-light partial beam 7aa, two emergent illumination-light partial beams $7_6$ and $7_5$ from the incident illumination-light partial beam 7bb, two emergent illumination-light partial beams $7_4$ and $7_3$ from the incident illumination-light partial beam 7ab, and the emergent illumination-light partial beams $7_2$ and $7_1$ from the incident illumination-light partial beams 7ba. The emergent illumination-light partial beams $7_1$ to $7_8$ of the last cascade III are aligned such that they are parallel using mirrors 22. In the following beam path, the eight emergent illumination-light partial beams $7_1$ to $7_8$ each travel along individual beam paths with associated beam shaping units 10, which guide the illumination-light partial beams $7_1$ to $7_8$ to a total of eight object fields 2, which are imaged by associated projection optical units 11 onto in each case one associated image field out of a total of eight image fields 12 of the projection exposure apparatus 1 for projecting the reticle section arranged in the object field onto wafers arranged in the image field.

A polarization direction of the emergent illumination-light partial beams $7_1$ to $7_8$ is indicated in FIG. 1 by way of a double-headed arrow.

An intensity distribution between the eight illumination-light partial beams $7_1$ to $7_8$ can be defined by way of correspondingly tilting the MEMS mirrors 17 and the subsequent distribution of the reflection efficiency into the various orders of diffraction of the illumination-light partial beams $7_1$ to $7_8$.

The respective blazed reflection grating 9 can be operated under a grazing incidence of the illumination light 7.

Each of the blazed reflection gratings 9 can be adjusted such that the incident illumination light 7 is reflected completely into exactly one order of diffraction. In this way, the above-described beam distribution optical units 8 and 14 can be operated such that a smaller number of object fields is lit and thus a smaller number of projection exposure scanners is operated than is possible in principle. The remaining scanners can be operated in that case for example at a higher intensity of the illumination light 7.

An angle α between the orders of diffraction of the emergent illumination-light partial beams can be smaller in the illumination distribution optical unit 14 or in the cascade III of the beam distribution optical unit 8 than 2 mrad.

A distribution of the intensity of the incident illumination-light beams 7 into the emergent illumination-light beams $7a$, $7b$ within the cascades I, II and III can be effected in each case at a ratio of 1:1. This ensures an equal distribution of the intensities with respect to the subsequently used illumination-light partial beams $7_1$ to $7_8$.

In the beam distribution optical unit 8 of FIG. 1, each illumination-light partial beam $7_1$ to $7_8$ undergoes exactly three reflections at the blazed reflection gratings 9.

In the beam distribution optical unit 8, each illumination-light beams $7_1$ to $7_8$ is reflected in the optical path within the beam distribution optical unit 8 by the grating structures 17 of a plurality of blazed reflection gratings, specifically in each case a blazed reflection grating 9 of the cascades I, II and III.

Figure 3:
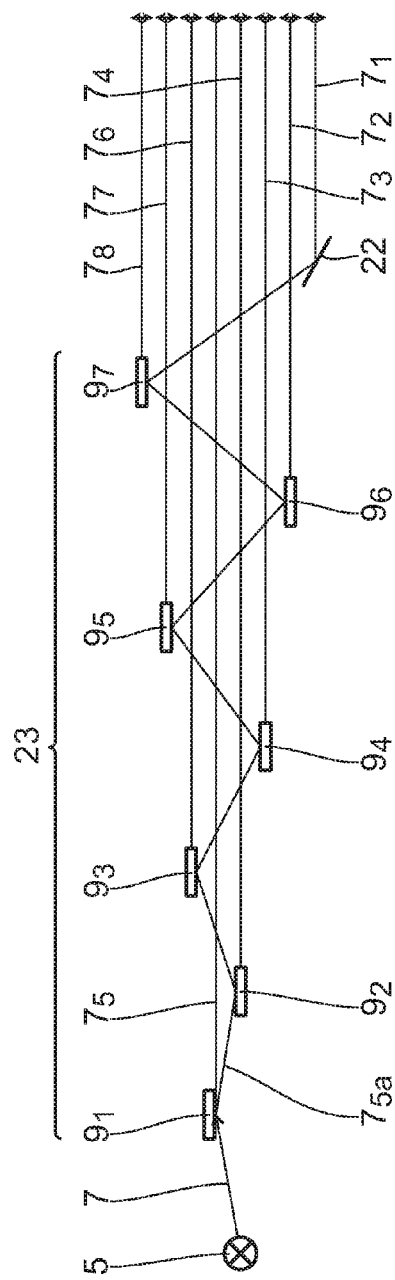
FIG. 3 shows a further embodiment of the beam distribution optical unit for splitting the incident beam into a total of eight emergent illumination-light beams.

FIG. 3 shows a further embodiment of a beam distribution optical unit 23 that can be used instead of the beam distribution optical unit 8. Components corresponding to those which have already been explained above with reference to FIGS. 1 and 2 have the same reference numerals and will not be discussed in detail again.

An arrangement of the total of seven blazed reflection gratings $9_i$ (i=1, . . . , 7) in the beam distribution optical unit 23 is of a type such that a maximum of one of the two illumination-light partial beams that are each emergent from a blazed reflection grating 9 is further split at at least one further blazed reflection grating. The illumination-light partial beam $7_5$ in the beam distribution optical unit 23 was produced only through reflection at the blazed reflection grating $9_1$ that came first in the beam path of the illumination light 7. The illumination-light partial beam $7_4$ is lastly reflected in the beam path at the second blazed reflection grating $9_2$. The illumination-light partial beam $7_6$ is lastly reflected at the third blazed reflection grating $9_3$. The illumination-light partial beam $7_3$ is lastly reflected at the fourth blazed reflection grating $9_4$. The illumination-light partial beam $7_7$ is lastly reflected at the fifth blazed reflection grating $9_5$. The illumination-light partial beam $7_2$ is lastly reflected at the sixth blazed reflection grating $9_6$. The illumination-light partial beam $7_8$ is lastly reflected at the seventh and last blazed reflection grating $9_7$ of the beam distribution optical unit. The illumination-light partial beam $7_1$ is also reflected at a deflection mirror 22 after reflection at the last blazed reflection grating $9_7$.

With respect to the association of the illumination-light partial beams with the number of reflections in the beam distribution optical unit 23, the following table applies:

| Illumination-light partial beam | Number of reflections in the beam distribution optical unit 23 |
|---|---|
| $7_1$ | 8 |
| $7_2$ | 6 |
| $7_3$ | 4 |
| $7_4$ | 2 |
| $7_5$ | 1 |
| $7_6$ | 3 |
| $7_7$ | 5 |
| $7_8$ | 7 |

The different number of reflections to produce the illumination-light partial beams $7_1$ to $7_8$ can be used when specifying respectively desired intensities of the illumination-light partial beams $7_1$ to $7_8$.

Minimum angular distances between the orders of diffraction at the gratings $9_1$ to $9_7$ are obtained at an assumed beam cross-section in the drawing plane of FIG. 3 of 10 mm and a distance in a main propagation direction of the illumination light 7, toward the right in FIG. 3, between the individual blazed reflection gratings $9_i$ of in each case 3 m according to the following table:

| Blazed reflection grating | Angular distance of the direction of reflection between the two used orders of diffraction |
|---|---|
| $9_1$ | 3.3 mrad |
| $9_2$ | 6.7 mrad |
| $9_3$ | 10 mrad |
| $9_4$ | 13.3 mrad |
| $9_5$ | 16.7 mrad |
| $9_6$ | 20 mrad |
| $9_7$ | 23.3 mrad |

The reflections at the blazed reflection gratings $9_1$ to $9_7$ in the beam distribution optical unit 23 can be specified such that the illumination-light partial beams $7_2$ to $7_8$ exit the beam distribution optical unit 23 with a parallel propagation direction.

Figure 4:
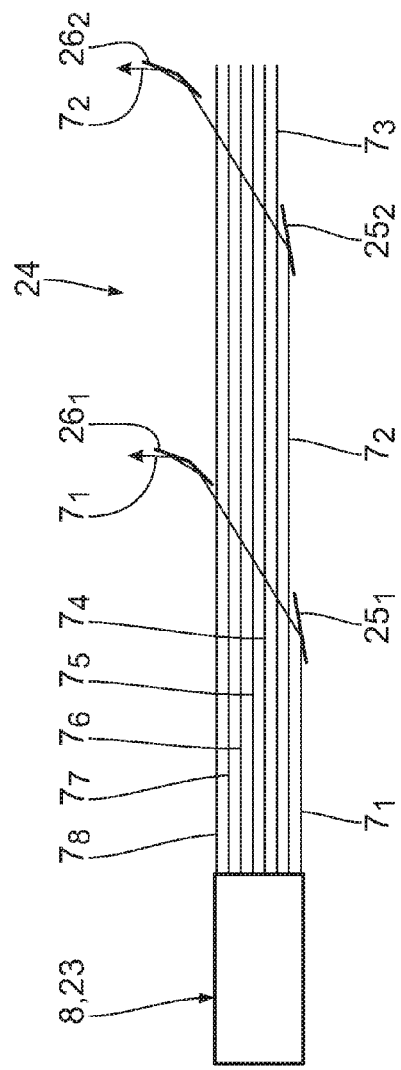
FIG. 4 shows an output coupling optical unit for decoupling individual illumination-light beams that are emergent from the beam distribution optical unit of FIG. 1 or 3 each to an object field to be imaged during the projection exposure.

FIG. 4 shows by way of example one embodiment of an output coupling optical unit 24 for decoupling the respective illumination-light partial beams $7_1$ to $7_8$ from the illumination-light partial beams which propagate together in parallel up to the respective object field. This decoupling is effected via in each case a plurality of mirrors 25, 26, which are operated at grazing incidence, i.e. as grazing-incidence mirrors. A total deflection by the respective mirror sequence $25_i$, $26_i$ for decoupling the illumination-light partial beam $7_i$ is approximately 90°.

Figure 5:
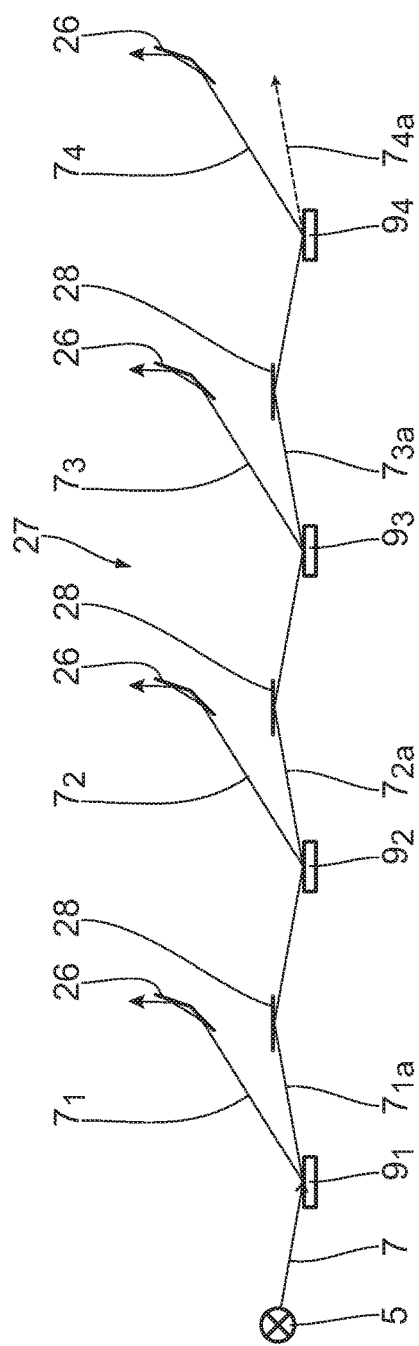
FIGS. 5 to 7 show further embodiments of beam distribution optical units having downstream output coupling optical units which can be used in a projection exposure apparatus with a plurality of object fields that are able to be subjected in parallel to the illumination light and are to be imaged during the projection exposure.

FIG. 5 shows a further embodiment of a beam distribution optical unit 27, which at the same time has the function of an output coupling optical unit of the type of the output coupling optical unit 24 of FIG. 4.

A sequence of the arrangement of the blazed reflection gratings $9_1$, $9_2$, . . . in the beam distribution optical unit 27 is comparable with the arrangement of FIG. 3. One of the respectively two emergent illumination-light partial beams is decoupled immediately to an object field (cf. illumination-light partial beam $7_1$ in FIG. 5). The other emergent illumination-light partial beam (cf. $7_{1a}$ in FIG. 5) is guided to the next blazed reflection grating $9_2$. In order to ensure a common plane of incidence of the respective illumination-light partial beams 7 on the blazed reflection gratings $9_i$, another deflection of the respective illumination-light partial beam 7 is effected via a deflection mirror 28 in the beam path between the blazed reflection gratings $9_i$, $9_{i+1}$.

What is shown is the beam distribution optical unit 27 for producing a total of four illumination-light partial beams $7_1$ to $7_4$, which can be used for illuminating four separate object fields 2 of corresponding scanners for projection exposure of four separate reticles. A beam path $7_{4a}$ is indicated in dashed lines in FIG. 5, by way of which a following sequence of blazed reflection gratings $9_5$, . . . can be arranged downstream for producing further illumination-light partial beams $7_5$, . . . .

A non-decoupled main illumination-light beam 7, $7_{1a}$, $7_{2a}$, $7_{3a}$, $7_{4a}$ in the beam distribution optical unit 27 travels along a zigzag path.

The grating $9_1$ can firstly decouple the partial beams $7_5$, and $7_{5a}$ (toward the grating $9_2$) at an intensity ratio of 1:7. It is possible to ensure via corresponding asymmetrical output coupling ratios that all illumination-light partial beams $7_1$ to $7_8$ used for object-field illumination have the same intensities.

Figure 6:
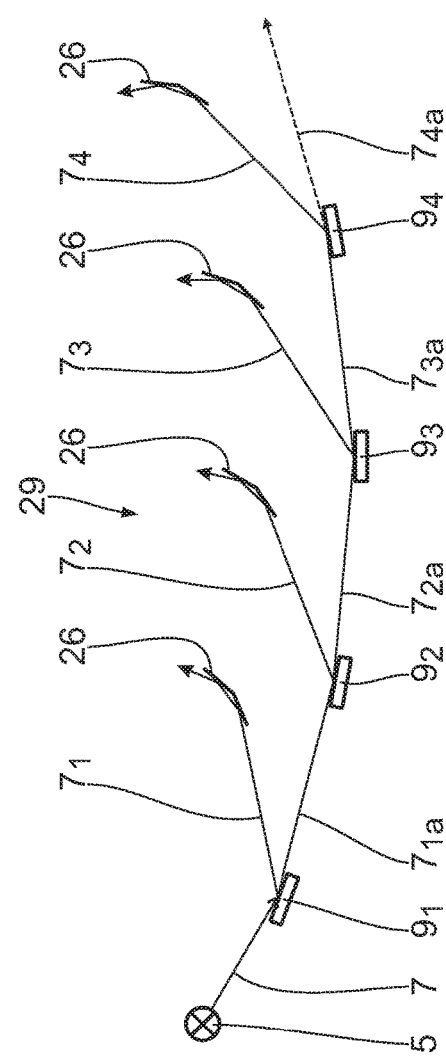

In a beam distribution optical unit 29 according to FIG. 6, the deflection mirrors 28 are omitted, as compared to the beam distribution optical unit 27. This produces a beam guidance of the illumination-light partial beam which is to be split in each case such that this non-decoupled main illumination-light beam 7, $7_{1a}$, $7_{2a}$, $7_{3a}$, . . . travels along a polygonal path which is deflected in each case in the same direction.

For the microlithographic production of microstructured or nanostructured components using the projection exposure apparatus 1, first one substrate or one wafer each is provided in the respective image field 12 in the wafer plane 13. A layer composed of a light-sensitive material is at least partly applied to the respective wafer. One reticle each having imaging structures is furthermore provided in the respective reticle plane 3. The projection exposure apparatus 1 is then used to project the portion of the respective reticle arranged in the object field 2 onto a region of the respective layer arranged in each case in the image field.

Figure 7:
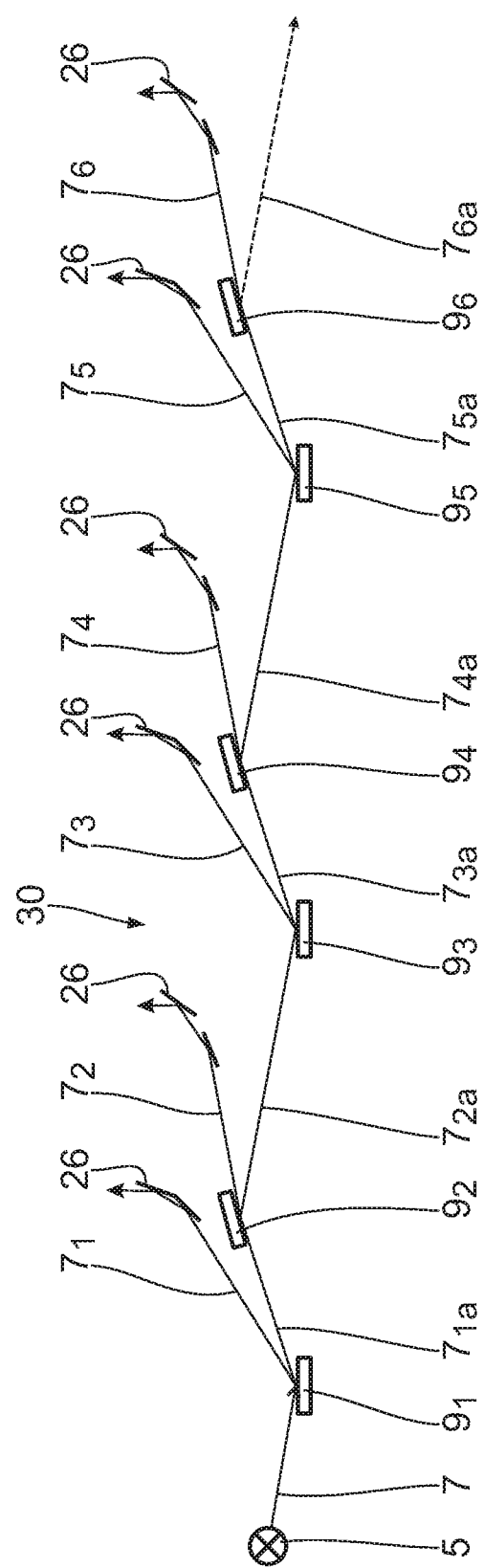

FIG. 7 shows a beam distribution optical unit 30 which can be understood to be a combination of the optical arrangements of FIGS. 5 and 6. In the beam distribution optical unit 30, the main beam 7, $7_{1a}$, $7_{2a}$, . . . is likewise guided along a zigzag path. However, the deflections along this zigzag path are effected in each case by blazed reflection gratings $9_1$, $9_2$, . . . , with the result that no separate deflection mirrors are necessary. The respectively decoupled beam $7_1$, $7_2$, . . . is guided in turn by deflection mirrors 26, which are part of the output coupling optical unit, to the respective object field.

What is claimed is:

1. An illumination optical unit, comprising:
   a beam distribution optical unit, comprising:
      a blazed reflection grating comprising reflective grating structures,
   wherein the beam distribution optical unit is configured to split an incident beam of illumination light into at least two emergent used illumination-light beams, and the illumination optical unit configured to illuminate an object field with the at least two emergent used illumination-light beams, and
   wherein at least one of the following holds:
      the reflective grating structures are tiltable to provide a blaze angle; and
      the illumination optical unit further comprises actuators configured to tilt the reflective grating structures to provide the blaze angle.

2. The illumination optical unit of claim 1, wherein the reflective grating structures comprise MEMS mirrors.

3. The illumination optical unit of claim 1, wherein a grating period of the blazed reflection grating is 80 to 150 times as large as a used wavelength of the illumination light.

4. The illumination optical unit of claim 1, comprising a plurality of blazed reflection gratings configured to be sequentially subjected to the illumination light.

5. The illumination optical unit of claim 1, wherein the beam distribution optical unit is configured so that each illumination-light beam within the beam distribution optical unit is reflected by the grating structures of a plurality of blazed reflection gratings.

6. The illumination optical unit of claim 1, wherein the beam distribution optical unit is configured so that a maximum of one of two emergent illumination-light beams produced by a blazed reflection grating is further split by reflection at at least one further blazed reflection grating.

7. An optical system, comprising:
   an illumination optical unit according to claim 1; and
   a projection optical unit configured to image the object field into an image field.

8. The optical system of claim 7, wherein at least one of the blazed reflection gratings comprises part of an output coupling optical unit which directs an illumination-light beam to the projection optical unit.

9. The optical system of claim 7, wherein the optical system is configured so that beam guidance is such that a non-decoupled main beam travels along a zigzag path within the beam distribution optical unit.

10. The optical system of claim 7, wherein the optical system is configured so that beam guidance is such that a non-decoupled main beam travels along polygonal path, in each case deflected in the same direction, within the beam distribution optical unit.

11. An apparatus, comprising:
    a primary light source;
    an illumination optical unit according to claim 1; and
    a projection optical unit configured to image the object field into an image field,
    wherein the apparatus is a lithographic projection exposure apparatus.

12. The apparatus of claim 11, wherein the reflective grating structures comprise MEMS mirrors.

13. The apparatus of claim 11, wherein a grating period of the blazed reflection grating is 80 to 150 times as large as a used wavelength of the illumination light.

14. The apparatus of claim 11, wherein the illumination optical unit comprises a plurality of blazed reflection gratings configured to be sequentially subjected to the illumination light.

15. The apparatus of claim 11, wherein the beam distribution optical unit is configured so that each illumination-light beam within the beam distribution optical unit is reflected by the grating structures of a plurality of blazed reflection gratings.

16. The apparatus of claim 11, wherein the beam distribution optical unit is configured so that a maximum of one of two emergent illumination-light beams produced by a blazed reflection grating is further split by reflection at at least one further blazed reflection grating.

17. A method of using a lithographic projection exposure apparatus comprising an illumination optical unit and a projection optical unit, the method comprising:

using the illumination optical unit to illuminate structures of a plurality of reticles; and using the projection optical unit to project illuminated structures of the reticle onto corresponding layers of light-sensitive material, wherein the illumination optical unit is an illumination optical unit according to claim 1.

18. The illumination optical unit of claim 1, further comprising an actuation device configured to displace the grating structures to change the blaze angle.

19. The illumination optical unit of claim 1, wherein the grating structures are tiltable to provide the blaze angle.

20. The illumination optical unit of claim 1, further comprising actuators configured to tilt the grating structures to provide the blaze angle.

* * * * *

UNITED STATES PATENT AND TRADEMARK OFFICE
CERTIFICATE OF CORRECTION

PATENT NO. : 10,061,203 B2  
APPLICATION NO. : 15/244234  
DATED : August 28, 2018  
INVENTOR(S) : Markus Deguenther, Michael Patra and Thomas Korb Page 1 of 1

It is certified that error appears in the above-identified patent and that said Letters Patent is hereby corrected as shown below:

On the Title Page

Item (72) (Inventors), Line 3, delete "Schwarbisch" and insert -- Schwaebisch --, therefor.

In the Specification

Column 7, Line 33 (Approx.), delete "beams" and insert -- beam --, therefor.

Column 8, Line 46, delete "beams" and insert -- beam --, therefor.

Signed and Sealed this  
Twenty-sixth Day of March, 2019

Andrei Iancu  
*Director of the United States Patent and Trademark Office*